(12) United States Patent
Kim

(10) Patent No.: US 7,307,563 B2
(45) Date of Patent: Dec. 11, 2007

(54) APPARATUS AND METHOD FOR PERFORMING DITHERING IN COMMUNICATION SYSTEM USING ORTHOGONAL FREQUENCY DIVISION MULTIPLEXING SCHEME

(75) Inventor: Byung-Ki Kim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/287,945

(22) Filed: Nov. 28, 2005

(65) Prior Publication Data

US 2006/0119492 A1   Jun. 8, 2006

(30) Foreign Application Priority Data

Dec. 3, 2004   (KR) ............. 10-2004-0101161

(51) Int. Cl.
*H03M 1/20*   (2006.01)
(52) U.S. Cl. ..................... 341/131; 341/126
(58) Field of Classification Search ......... 341/121–155
See application file for complete search history.

(56) References Cited

U.S. PATENT DOCUMENTS

| | | | | |
|---|---|---|---|---|
| 4,937,576 | A   * | 6/1990 | Yoshio et al. | 341/131 |
| 5,525,984 | A   * | 6/1996 | Bunker | 341/131 |
| 6,016,113 | A   * | 1/2000 | Binder | 341/131 |
| 6,091,398 | A   * | 7/2000 | Shigeta | 345/204 |
| 6,249,696 | B1 * | 6/2001 | Olson et al. | 600/509 |
| 6,271,936 | B1 * | 8/2001 | Yu et al. | 358/3.04 |
| 6,738,002 | B2 * | 5/2004 | Ercan et al. | 341/131 |
| 7,012,717 | B1 * | 3/2006 | Easwar | 358/3.13 |
| 2004/0210611 | A1 * | 10/2004 | Gradishar et al. | 708/271 |

* cited by examiner

*Primary Examiner*—Lam T. Mai
(74) *Attorney, Agent, or Firm*—The Farrell Law Firm

(57) ABSTRACT

Disclosed are an apparatus and a method for performing dithering in a communication system using an orthogonal frequency division multiplexing scheme. A method for adding dithering noise in a communication system employing an orthogonal frequency division multiplexing scheme includes receiving a signal, and generating dithering periodic noise and adding the dithering noise to the received signal.

9 Claims, 11 Drawing Sheets

APPARATUS AND METHOD FOR PERFORMING DITHERING IN COMMUNICATION SYSTEM USING ORTHOGONAL FREQUENCY DIVISION MULTIPLEXING SCHEME

PRIORITY

This application claims priority to an application entitled "Apparatus and Method for Performing Dithering in Communication System Using Orthogonal Frequency Division Multiplexing Scheme" filed in the Korean Intellectual Property Office on Dec. 3, 2004 and assigned Serial No. 2004-101161, the contents of which is incorporated herein by reference.

BACKGROUND OF THE INVENTION

1. Field of the Invention

The present invention relates to a communication system using an orthogonal frequency division multiplexing (OFDM) scheme, and more particularly to an apparatus and a method for performing dithering in a OFDM-based communication system.

2. Description of the Related Art

Generally, the procedure for converting an analog signal into a digital signal in a communication system is divided into sampling, quantizing, and coding.

The sampling refers to a procedure of obtaining samples in order to convert continuously changing analog signals into a digital signal having a discrete form. A sampling rate refers to the number of samples per second (the number of digitization). The unit of the sampling rate is hertz "Hz" (frequency unit).

The quantizing refers to a procedure of approximating to the nearest integer value each signal point sampled according to the sampling rate. In other words, the sampling is a digitization procedure over time, and a digitization procedure for signal intensity is quantizing. When the analog signal is expressed as quantization bits through the sampling, errors occur. During this procedure, the difference that may occur between an input signal and a quantized output signal is referred to as a "quantization error". The number of quantization bits must increase in order to minimize the quantization error. However, if the number of quantization bits increases, system or terminal realization costs increase. In addition, as the number of quantization bits increases, the number of computations for the quantization also increases.

Dithering is a scheme in which a wide-range signal can be digitized or low-bit quantized without signal distortion by increasing an available dynamic range in the process of converting an analog signal into a digital signal even when the signal is digitized or quantized by using a smaller number of quantization bits.

In more detail, the dithering is a scheme in which quantization noises and sound distortion can be minimized by artificially adding white gaussian noise or dithering noise in the process of converting an analog signal into a digital signal. Accordingly, the low-bit quantization can be achieved by adding noise to a high-bit quantized signal when converting an analog signal into a digital signal.

Hereinafter, a phenomenon in which harmonics appear when dithering noise is not added will be described using graphs with reference to FIGS. 1A and 1B.

FIGS. 1A and 1B show a typical signal waveform when dithering noise is not added.

FIG. 1A shows a graph illustrating a waveform of a signal obtained by sampling a 1 kHz analog signal using a 44 kHz sampling frequency and then 8-bit quantizing the sampled signal. In the graph shown in FIG. 1A, an x-axis represents time, and a y-axis represents voltage intensity or current intensity.

FIG. 1B shows a graph illustrating a spectrum of a signal obtained by sampling a 1 kHz analog signal using a 44 kHz sampling frequency and then 8-bit quantizing the sampled signal.

Generally, an average voice falls within the audible frequency range of 15 kHz to 20 kHz, and a signal component having a frequency of above 20 kHz is included in an ultrasonic wave range which cannot be detected by human ears. However, it can be understood from FIG. 1B that a harmonic component interfering with a signal may have a power level much higher than an average quantization noise power level of −10 dB.

FIG. 2 shows a block diagram illustrating the structure of a typical receiver employing dithering.

The receiver receives an analog signal transmitted from a transmitter and adds to the received signal noise generated from a dithering noise generator 202. The dithering noise generator 202 includes a noise shaping filter 204 and a random noise generator 206. The random noise generator 206 generates random noise and outputs the random noise to the noise shaping filter 204. The noise shaping filter 204 removes interference of an audible frequency band using the dithering noise. The random noise having passed through the shaping filter 204 has only a non-audible frequency band component, so that interference does not occur in the audible frequency band.

A low-bit analog-digital converter (ADC) 208 receives a signal obtained by adding the dithering noise to the analog signal and converts the signal into a digital signal. It is assumed that the ADC 208 outputs the digital signal by performing low-bit quantization.

FIG. 3 is a graph illustrating a typical waveform of a signal with dithering noises.

As shown through the graph of FIG. 3, the signal obtained by adding the dithering noise to the analog signal has no harmonic component after an analog-digital converting procedure including low-bit quantizing.

An average power in a time domain is proportional to the number of sub-carriers in a typical OFDM system. For example, if the OFDM system employs a smaller number of sub-carriers, a received OFDM signal intensity in a time domain could be less than a minimum quantization level. In this case, OFDM system performance may be degraded. A description of the performance degradation will be given with reference to FIGS. 4A to 4C.

FIGS. 4A to 4C show conventional problems occurring when input signal intensity is lower than low-bit quantization level in a time domain.

FIG. 4A is a graph illustrating a waveform of a low-bit quantized signal when input signal intensity is less than a low-bit quantization level in a time domain.

FIG. 4B is a graph illustrating power spectral density (PSD) of an input signal when input signal intensity is less than a low-bit quantization level in a time domain.

FIG. 4C is a graph illustrating signal constellation after Fast Fourier Transform (FFT) when input signal intensity is less than a low-bit quantization level in a time domain.

As shown in FIG. 4C, when input signal intensity is less than a low-bit quantization level in a time domain, a Signal to Noise Ratio (SNR) of the input signal becomes 5.2 dB. When the input signal intensity is greater than the low-bit quantization level (in a case of a 8-bit quantization level) in the time domain, an ideal SNR is 20.8 dB, so the SNR of 5.2 dB represents the degradation of performance.

In addition, frequency components of dithering noise added to the received analog signal may be similar to a frequency component of the received analog signal. In other words, frequency components of the dithering noise may be close to sub-carrier indices of the received analog signal. In this case, the dithering noise acts as interference signals with respect to the received analog signal.

SUMMARY OF THE INVENTION

Accordingly, the present invention has been made to solve at least the above-mentioned problems occurring in the prior art, and an object of the present invention is to provide an apparatus and a method, which can improve system performance by adding optimal dithering noise in a communication system employing an orthogonal frequency division multiplexing scheme.

To accomplish the above object, there is provided a method for adding dithering noise in a communication system employing an orthogonal frequency division multiplexing scheme, the method includes receiving a signal, and generating dithering noise having a preset period and adding the dithering noise to the received signal.

According to another aspect of the present invention, there is provided a method for adding dithering noise in a communication system which employs an orthogonal frequency division multiplexing scheme and converts a high-bit quantized signal into a low-bit quantized signal, the method includes generating dithering noise having a preset period and adding the dithering noise to a signal obtained by sampling a received analog signal using a preset sampling frequency and quantizing the received signal in a high-bit quantization level, performing a quantizing operation in a low-bit quantization level, and performing a Fast Fourier Transform operation and a demodulation operation with respect to a low-bit quantized signal.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENT

Figure 1A:
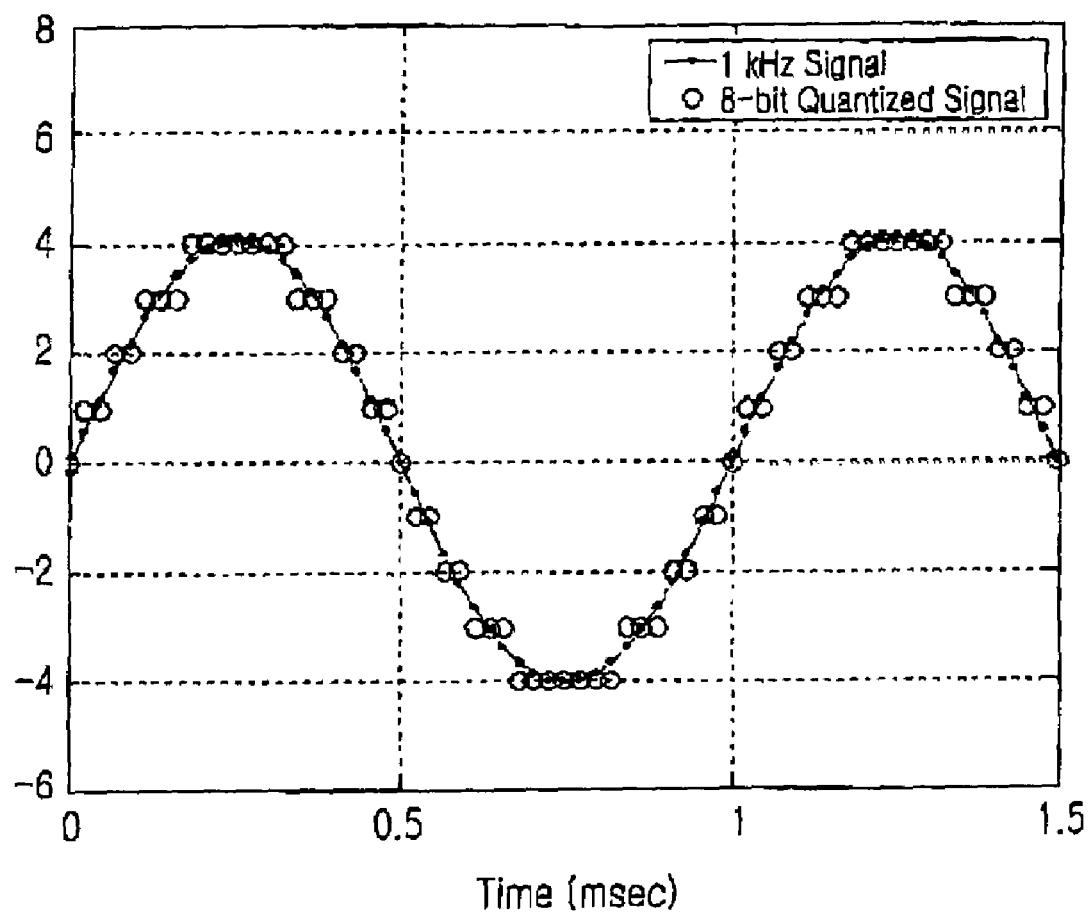
FIGS. 1A and 1B are graphs illustrating a typical signal waveform when dithering noise is not added.
Figure 1B:
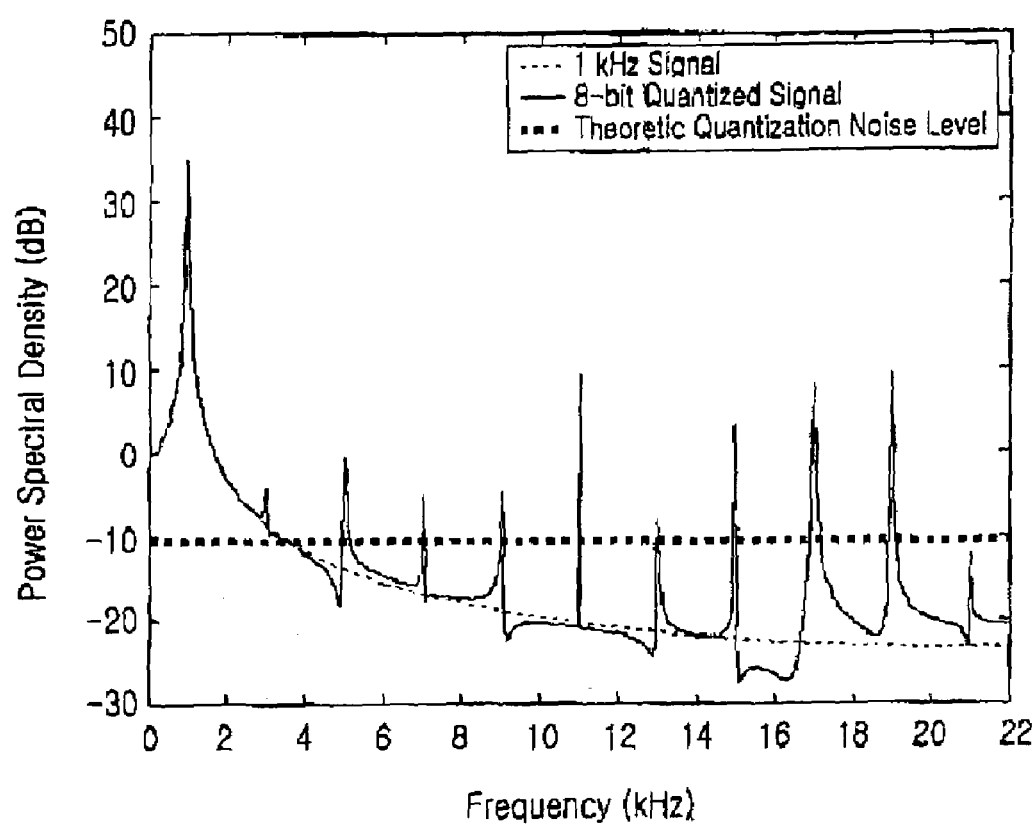
Figure 2:
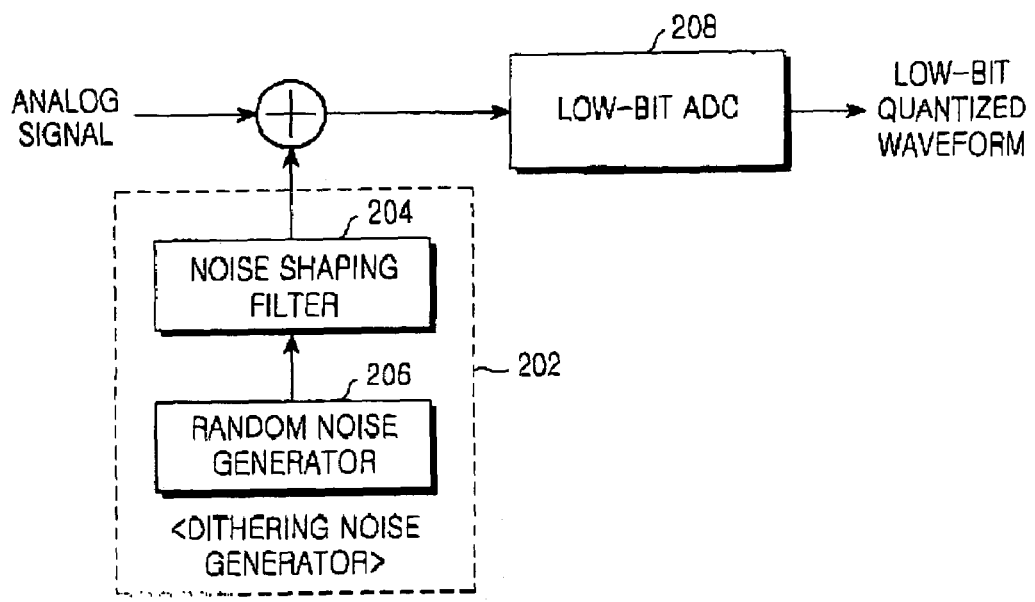
FIG. 2 is a block diagram illustrating the structure of a typical receiver employing dithering.
Figure 3:
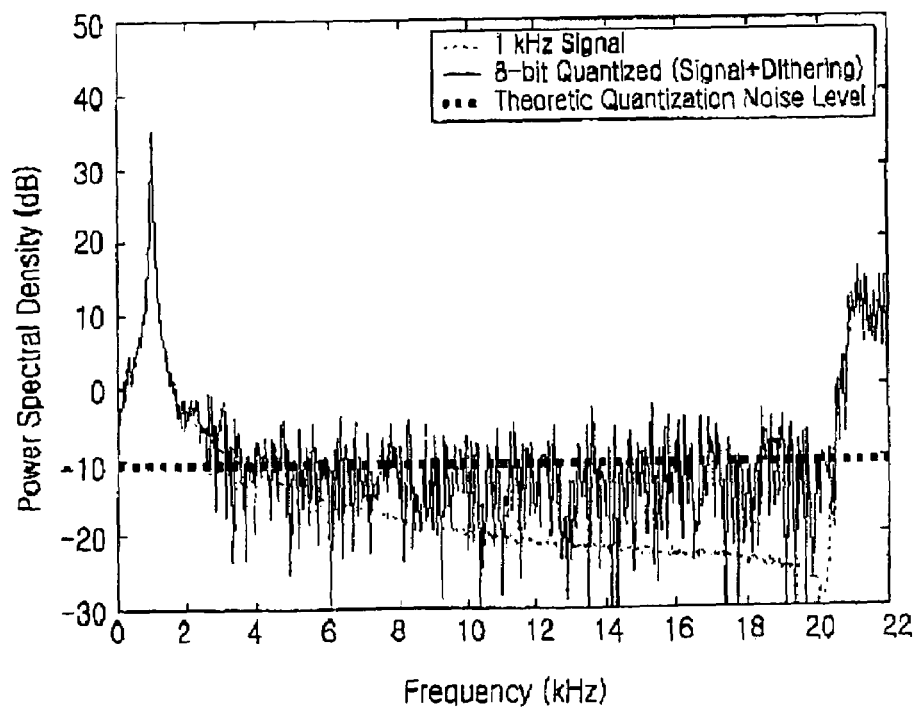
FIG. 3 is a graph illustrating a typical waveform of a signal with dithering noise.
Figure 4A:
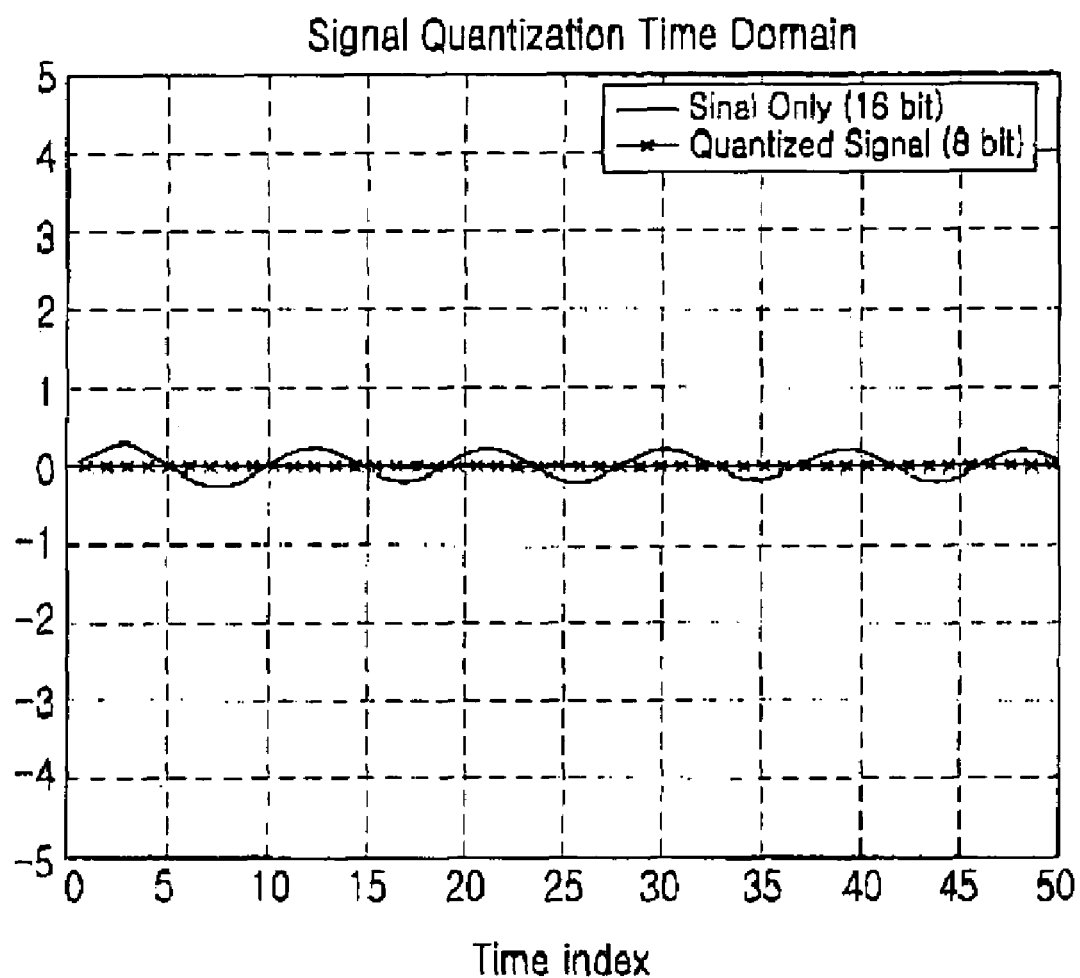
FIGS. 4A to 4C are graphs illustrating problems occurring when input signal intensity is lower than a low-bit quantization level in the conventional time domain.
Figure 4B:
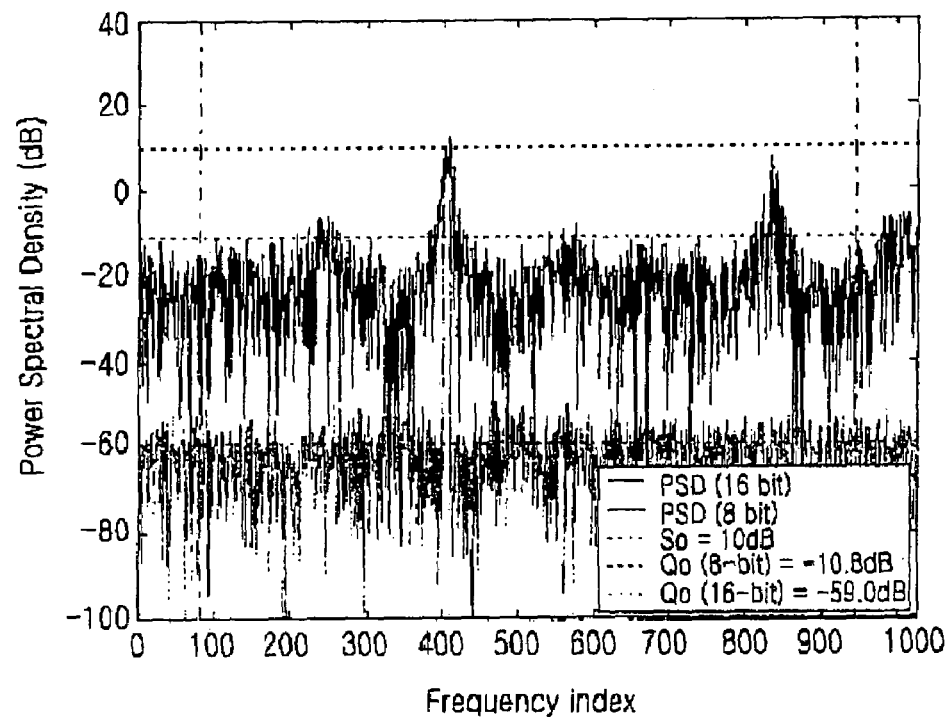
Figure 4C:
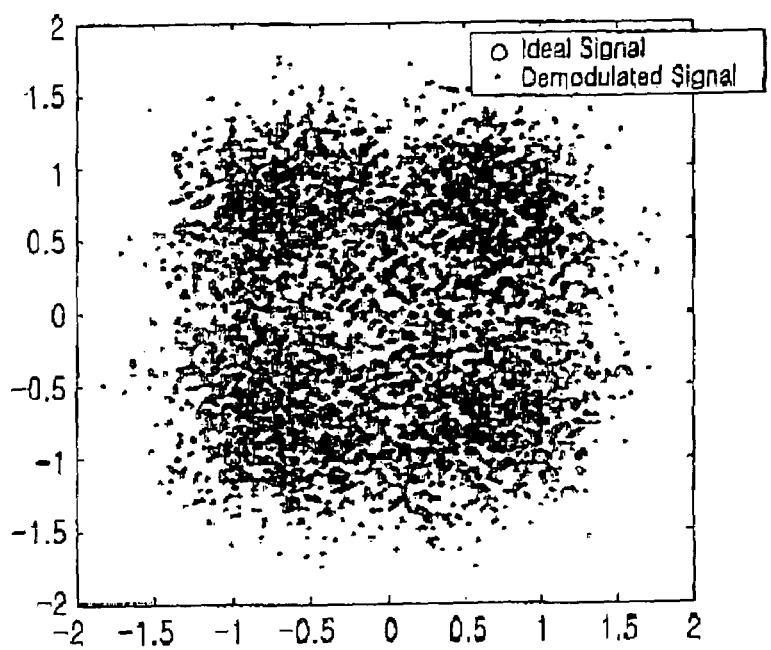

Hereinafter, preferred embodiments of the present invention will be described in detail with reference to the accompanying drawings. Note that the same or similar components in drawings are designated by the same reference numerals as far as possible although they are shown in different drawings. In the following description of the present invention, a detailed description of known functions and configurations incorporated herein will be omitted when it may make the subject matter of the present invention rather unclear.

The present invention proposes a method for adding periodic dithering noise to a received signal in a communication system employing an orthogonal frequency division multiplexing (OFDM) scheme or an orthogonal frequency division multiple access (OFDMA) scheme. Herein, the periodic dithering noise in time domain may be generated after Inverse Fast Fourier Transform (IFFT) using some or all of the unused sub-carriers (e.g., sub-carriers acting as guard intervals) in frequency domain.

For example, a sampling frequency for a predetermined signal is 44 kHZ, and 1024-point Fast Fourier Transform (FFT) is performed. A signal having sub-carrier components corresponding to integer times of "44000/1024=42.9688 Hz" is periodic in a time domain, and the sub-carriers of the signal are orthogonal to each other in a frequency domain. For example, a signal having a frequency of 515.625 Hz has continuous periodicity in a time domain before FFT, and the signal has no frequency components except for the frequency of 515.625 Hz in a frequency domain after FFT. In other words, since the signal maintains orthogonality with respect to the received signal, the signal does not act as an interference signal for the received signal. Accordingly, the signal having a frequency component of 515.615 Hz may be used as a dithering noise according to an embodiment of the present invention.

Accordingly, signals including frequency components corresponding to $$\frac{\text{sampling frequency}}{\text{the number of } FFT \text{ points}} \times M$$

(herein, M is an integer) will be used as dithering noise. If periodic dithering noise satisfying the condition are added to an analog signal or a digital signal, the dithering noise does not act as interference signals with respect to other frequencies except for their own frequencies, so that it is possible to improve system performance. The periodic dithering noise may be stored in a table form according to the number of points of FFT realized in the system, and the periodic dithering noise stored in the table may be used whenever the periodic dithering noise is added. In addition, since the periodic dithering noise is generated in such a manner it has have periods identical to the FFT sizes, the dithering noise may maintain orthogonality with respect to adjacent sub-carriers even though FFT is performed in a preset interval of a time domain.

Figure 5:
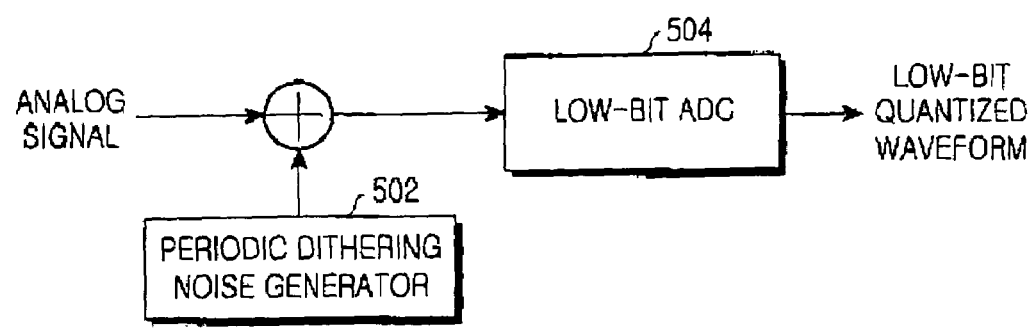
FIG. 5 is a block diagram illustrating the structure of a receiver for adding periodic dithering noise according to a first embodiment of the present invention.

FIG. 5 is a block diagram illustrating the structure of a receiver for adding periodic dithering noise according to a first embodiment of the present invention.

The receiver adds to a received analog signal dithering noise, which have continuity in a time domain and orthogonality in a frequency domain. In other words, a periodic dithering noise generator 502 adds periodic dithering noise to the received analog signal so as to output the added signal to a low-bit analog to digital converter (ADC) 504. The low-bit ADC 504 performs sampling and low-bit quantizing so as to output a low-bit quantized digital signal. Herein, if the low-bit quantization module, that is, the low-bit ADC 504 is realized in such a manner that a wide-range signal is digitized or low-bit quantized without signal distortion, it is possible to reduce both hardware realization costs and the number of computations required for the digitization or the low-bit quantization.

Figure 6:
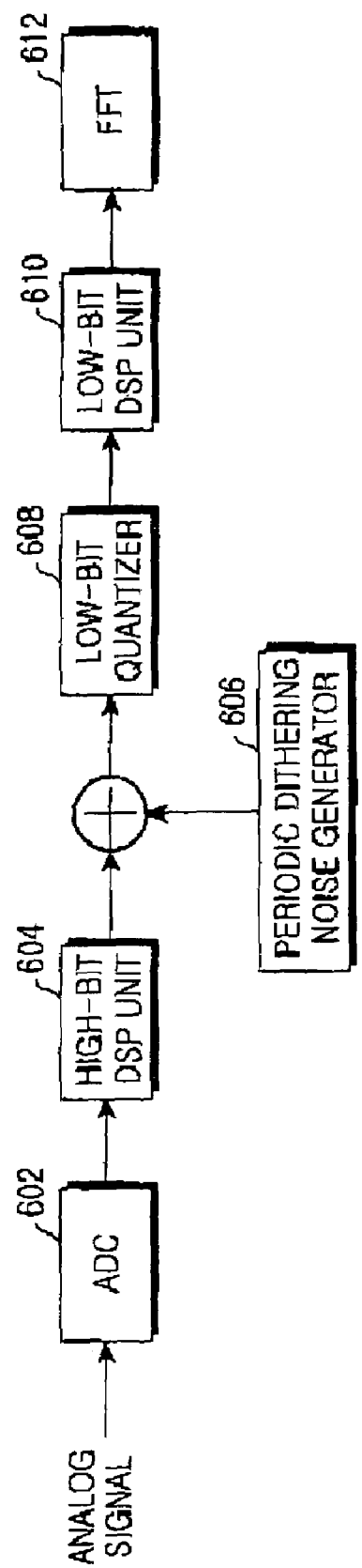
FIG. 6 is a block diagram illustrating the structure of a receiver for adding periodic dithering noise according to the second embodiment of the present invention.

FIG. 6 is a block diagram illustrating the structure of a receiver for adding periodic dithering noise according to the second embodiment of the present invention.

The receiver includes an ADC 602, a high-bit digital signal processing (DSP) unit 604, a periodic dithering noise generator 606, a low-bit quantizer 608, a low-bit DSP unit 610, and an FFT unit 612.

The ADC 602 performs sampling and high-bit quantizing for a received analog signal so as to output a high-bit quantized signal. The high-bit DSP unit 604 receives the high-bit quantized signal and performs a variety of signal processing procedures such as digital frequency down conversion, digital filtering, decimation, and digital automatic gain control. The periodic dithering noise generator 606 generates periodic dithering noise and adds the periodic dithering noise to the signal output from the high-bit DSP unit 604. The signal with the periodic dithering noise is input to the low-bit quantizer 608, and the low-bit quantizer 608 outputs a low-bit quantized signal.

The low-bit DSP unit 610 receives the low-bit quantized signal and performs a variety of signal processing procedures such as digital frequency down conversion, digital filtering, decimation, and digital automatic gain control. The FFT unit 612 having received the low-bit digitized signal Fast-Fourier-transforms a time domain signal into a frequency domain signal.

Figure 7:
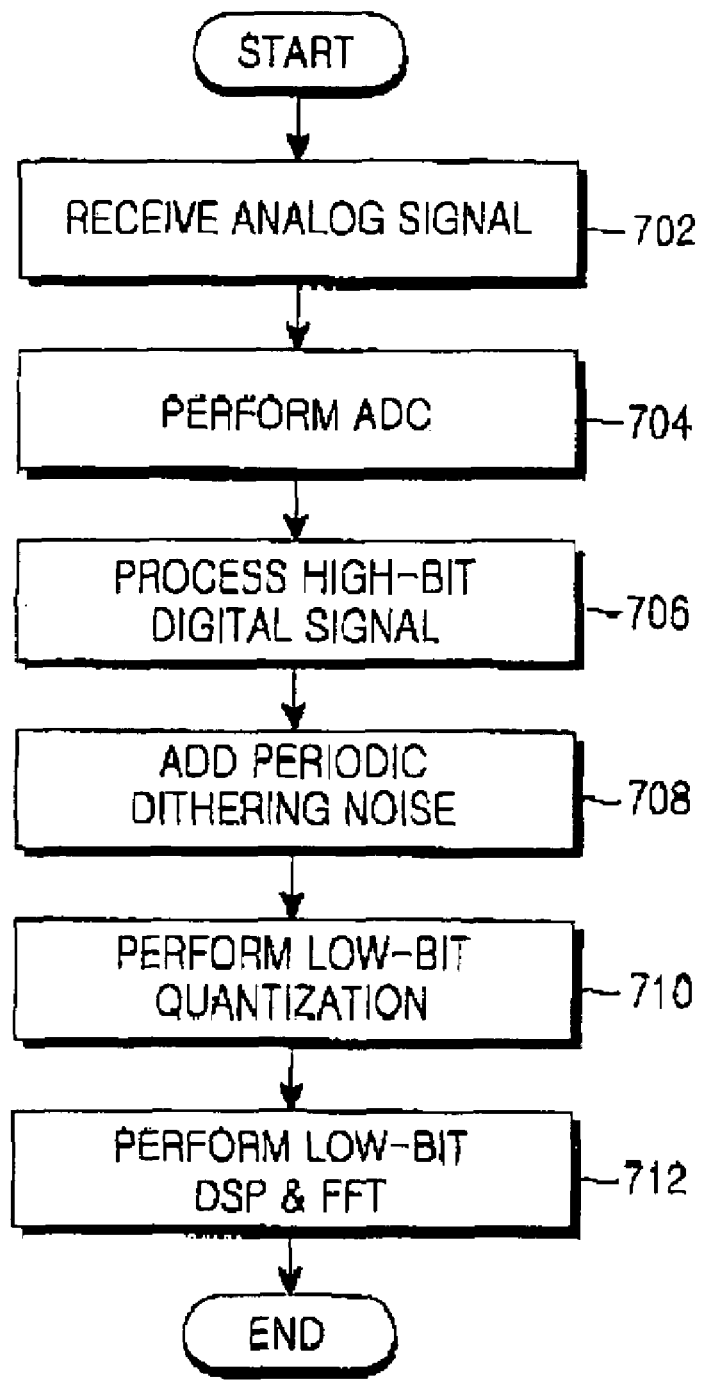
FIG. 7 is a flowchart illustrating a receiver operation procedure according to the second embodiment of the present invention.

FIG. 7 is a flowchart illustrating the operation of the receiver according to the second embodiment of the present invention.

In step 702, the receiver receives an OFDM- or OFDMA-based analog signal. In step 704, the receiver converts the analog signal into a digital signal. In this case, it is assumed that the receiver performs high-bit quantizing. In step 706, the receiver performs high-bit digital signal processing procedures such as digital frequency down conversion, digital filtering, decimation, and digital automatic gain control. In step 708, the receiver adds periodic dithering noises to the high-bit digitized signal. In step 710, the receiver performs low-bit quantizing for the signal obtained by adding the periodic dithering noises to the high-bit digitized signal. In step 712, the receiver performs low-bit digital signal processing and low-bit FFT.

Figure 8A:
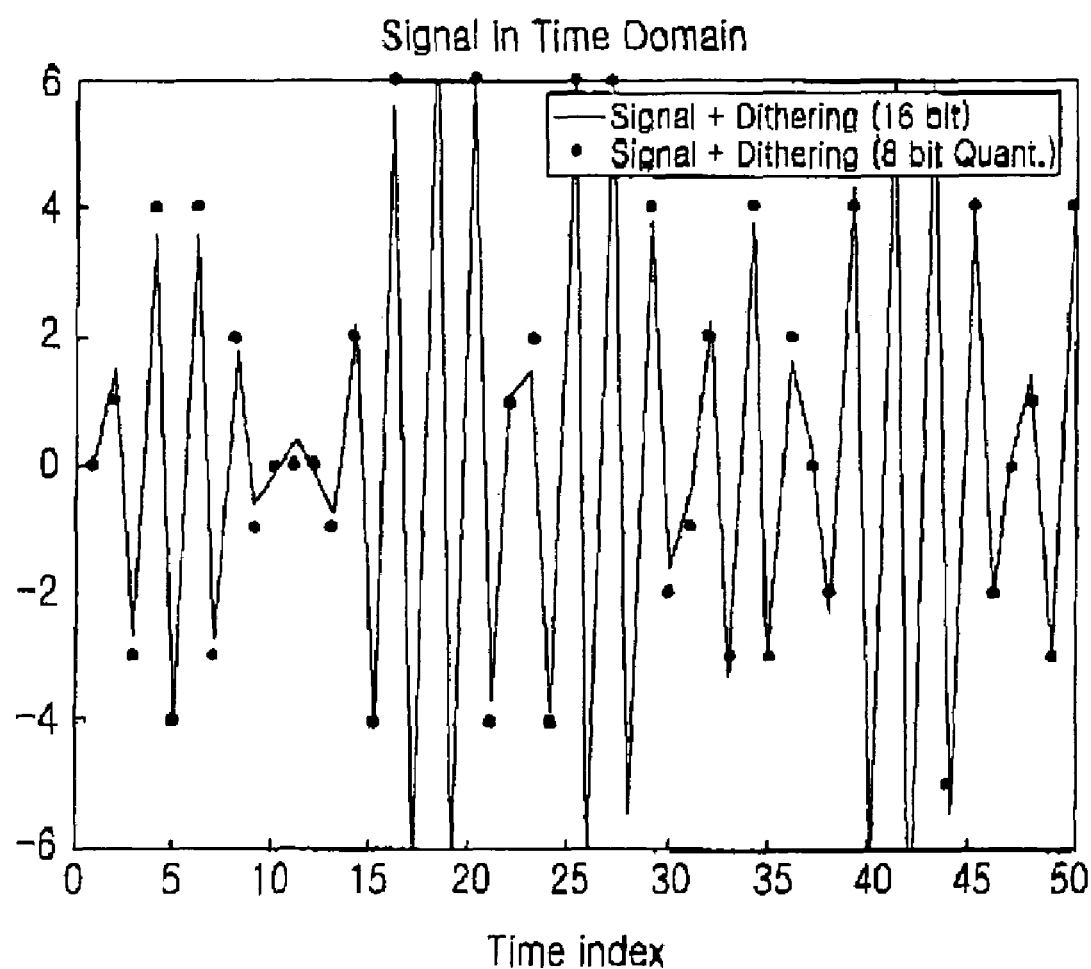
FIGS. 8A to 8C are graphs illustrating signal waveforms with the addition of periodic dithering noise according to embodiments of the present invention.
Figure 8B:
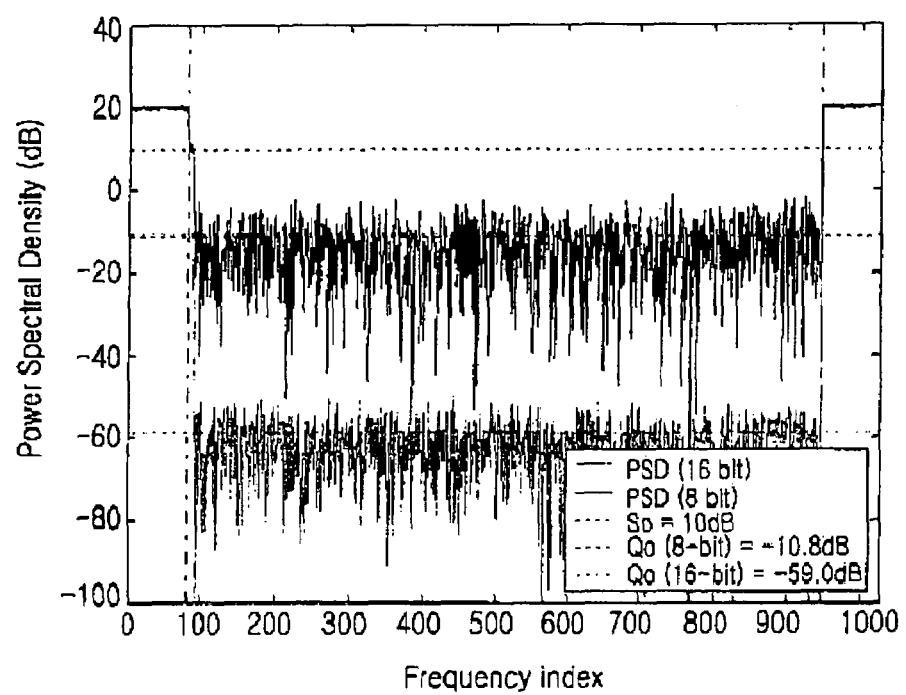
Figure 8C:
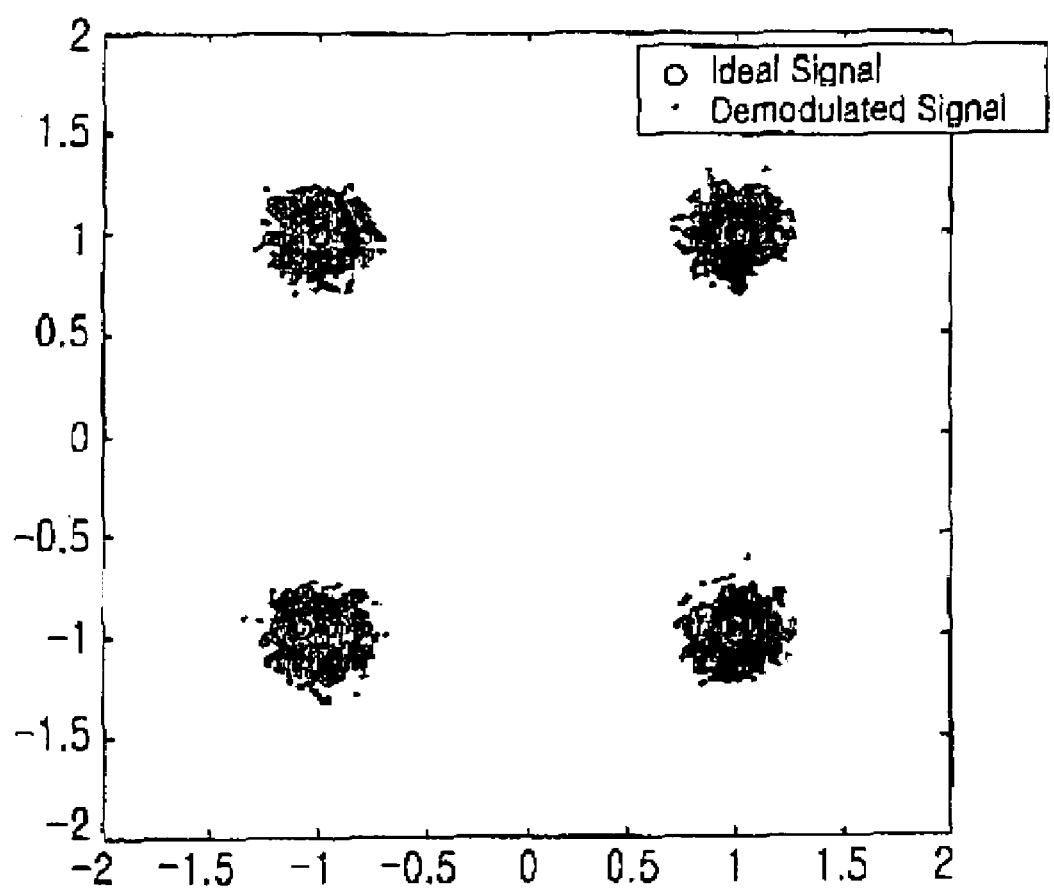

FIGS. 8A to 8C are graphs illustrating signal waveforms with the addition of periodic dithering noise according to embodiments of the present invention.

FIG. 8A is a graph illustrating a waveform of a signal obtained by adding periodic dithering noise to a received signal and performing low-bit quantizing for the added signal.

FIG. 8B is a graph illustrating power spectral density (PSD) of a received signal when periodic dithering noise are employed for the received signal.

FIG. 8C is a graph illustrating demodulated signal constellation after Fast Fourier Transform (FFT) when input signal intensity is less than a low-bit quantization level in a time domain.

The graphs shown in FIGS. 8A to 8C illustrate simulation results when an OFDMA system employs a 1024-point FFT unit and, from among 1024 sub-carriers, uses a sub-carrier having an index of 81 to a sub-carrier having an index of 944 as data or a pilot frequency band. In FIG. 8B, power spectral density (PSD; $S_0$) of the received signal between the sub-carrier having the index of 81 and a sub-carrier having an index of 90 in a use frequency band is 10.0 dB, a theoretical PSD ($Q_0$dB) of a quantization noise for a 8-bit signal is "$10 \times \log(1/12) = -10.8$ dB", and a theoretical PSD ($Q_0$dB) of a quantization noise for a 16-bit signal is "$10 \times \log(1/12) - 20 \times \log(2^8) = -59.0$ dB". Herein, the "$Q_0$" denotes theoretical PSD of a quantization noise for 8 bit or 16 bit signal. In the above description, since a quantization noise is a value obtained through quantizing, the quantization noise is different from a real sample value. The difference between the quantization value and the sample value corresponds to a quantization error, and the quantization error appears as a waveform distortion according to the addition of noise components through a channel. The waveform distortion is called the quantization noise.

According to the present invention, the SNR value of a demodulated signal shown in FIG. 8C becomes equal to a theoretical SNR value as 20.8 dB by performing dithering through the addition of the periodic dithering noise. Herein, when an 8-bit signal is demodulated, a theoretical SNR value becomes "$S_0(dB) - Q_0(dB) = 20.8$ dB".

According to the present invention, dithering is performed by adding periodic dithering noise in the process of converting an analog signal into a digital signal. Conventionally, when dithering noise is added into a frequency band adjacent to a frequency band of a received signal, the dithering noise act as an interference signal with respect to the received signal. However, according to the present invention, periodic dithering noise is added to the frequency band adjacent to the frequency band of the received signal, so the dithering noise does not act as an interference signal with respect to the received signal. Therefore, the system performance is improved. In addition, it is possible to perform low-bit quantizing due to the addition of the periodic dithering noise, thereby reducing the system realization costs and the number of computations required by a system.

While the invention has been shown and described with reference to certain preferred embodiments thereof, it will be understood by those skilled in the art that various changes in form and details may be made therein without departing from the spirit and scope of the invention. Consequently, the scope of the invention should not be limited to the embodiments, but should be defined by the appended claims and equivalents thereof.

What is claimed is:

1. A method for adding dithering noise in a communication system employing an orthogonal frequency division multiplexing scheme, the method comprising the steps of:
   receiving a signal; and
   generating periodic dithering noise and adding the dithering noise to the received signal,
   wherein the periodic dithering noise is generated using at least some of sub-carriers employed as guard intervals in time domain.

2. The method as claimed in claim 1, wherein the periodic dithering noise is added to a received analog signal.

3. The method as claimed in claim 1, wherein the periodic dithering noise is added after a received analog signal is converted into a digital signal.

4. A method for adding dithering noise in a communication system which employs an orthogonal frequency division multiplexing scheme and converts a high-bit quantized signal into a low-bit quantized signal, the method comprising the steps of:

generating periodic dithering noise and adding the dithering noise to a signal obtained by sampling a received analog signal using a preset sampling frequency and quantizing the received signal in a high-bit quantization level;

performing a quantizing operation in a low-bit quantization level; and performing a Fast Fourier Transform operation and a demodulation operation with respect to the low-bit quantized signal.

5. The method as claimed in claim 4, wherein the periodic dithering noise has frequency bands corresponding to an integer multiple of a value obtained by dividing the sampling frequency by the number of sub-carriers of the received signal.

6. The method as claimed in claim 5, wherein the periodic dithering noise in time domain is generated using at least some of sub-carriers employed as guard intervals in frequency domain.

7. An apparatus for performing dithering noises in a communication system which employs an orthogonal frequency division multiplexing scheme and converts a high-bit quantized signal into a low-bit quantized signal, comprising:

an analog-digital converter for sampling a received analog signal using a preset sampling frequency and quantizing the received signal in a high-bit quantization level;

a periodic dithering noise generator for generating periodic dithering noise and adding the dithering noise to a digitized signal;

a low-bit quantizer for performing a quantizing operation in a low-bit quantization level; and a Fast Fourier Transform unit for performing a Fast Fourier Transform operation and then a demodulation operation with respect to the low-bit quantized signal.

8. The apparatus as claimed in claim 7, wherein the periodic dithering noise generator generates the periodic dithering noise corresponding to an integer multiple of a value obtained by dividing the sampling frequency by the number of sub-carriers of the received signal.

9. The apparatus as claimed in claim 8, wherein the periodic dithering noise in time domain is generated using at least some of sub-carriers employed as guard intervals in frequency domain.

* * * * *